United States Patent [19]

McPartland

[11] Patent Number: 5,559,455
[45] Date of Patent: Sep. 24, 1996

[54] SENSE AMPLIFIER WITH OVERVOLTAGE PROTECTION

[75] Inventor: Richard J. McPartland, Nazareth, Pa.

[73] Assignee: Lucent Technologies Inc., Murray Hill, N.J.

[21] Appl. No.: 363,045

[22] Filed: Dec. 23, 1994

[51] Int. Cl.$^6$ ............................ G01R 19/00; G11C 11/40
[52] U.S. Cl. .............................. 327/53; 327/51; 327/74; 365/185.21
[58] Field of Search ................................. 327/51, 52, 53, 327/74, 77, 78, 81; 365/185.21

[56] References Cited

U.S. PATENT DOCUMENTS

| | | | |
|---|---|---|---|
| Re. 32,401 | 4/1987 | Bellstein, Jr. et al. | 365/182 |
| 3,882,467 | 5/1975 | Pricer | 340/173 |
| 4,286,178 | 8/1981 | Rao et al. | 307/355 |
| 4,298,810 | 11/1981 | Dinger et al. | 307/252 |
| 4,300,210 | 11/1981 | Chakravarti et al. | 365/45 |
| 4,301,518 | 11/1981 | Klaas | 365/185 |
| 4,791,324 | 12/1988 | Hodapp | 327/53 |
| 4,918,341 | 4/1990 | Galbraith et al. | 327/53 |
| 5,258,669 | 11/1993 | Nakashima | 327/78 |
| 5,272,674 | 12/1993 | Pathak et al. | 365/206 |
| 5,293,560 | 3/1994 | Harari | 365/185 |
| 5,390,147 | 2/1995 | Smarandoiu et al. | 365/185.21 |

FOREIGN PATENT DOCUMENTS

| 2122830 | 1/1984 | United Kingdom | 327/81 |
|---|---|---|---|

OTHER PUBLICATIONS

A Novel Automatic Erase technique Using an Internal Voltage Generator for 1MBIT Flash EEPROM, Kazuyoshi Shohji et al, 1990 Symposium on VLSI Circuits pp. 99–100.
A Quick Intelligent Program Architecture for 3 V–Only NAND–EEPROMs, Tomoharu Tanak et al, IEEE, 1992 Symposium on VLSI Circuits Digest of Technical Papers, pp. 20–21.

A High–Speed Clamped Bit–Line Current–Mode Sense Amplifier, Travis N. Blalock et al, IEEE Journal of Solid-–State Circuits, vol. 26, No. 4, Apr. 1991, pp. 542–548.

a 60ns 16Mb Flash EEPROM with Program and Erase Sequence Controller, Takeshi Nakayama et al, IEEE Journal of Solid State Circuits, vol. 26 No. 11, Nov. 1991, pp. 1600–1604.

Current–Mode Techniques for High–Speed VSLI Circuits with Application to Current Sense Amplifier for CMOS SRAM's, Evert Seevinck et al, IEEE Journal of Solid State Circuits, vol. 26, No. 4, Apr. 1991, pp. 525–536.

An 80ns 1–Mb Flash Memory with On–Chip Erasel Erase–Verify Controller, Koichi Sekj et al, IEEE Journal of Solid–State Circuits, vol. 25, No. 5, Oct. 1990, pp. 1147–1151.

*Primary Examiner*—Timothy P. Callahan
*Assistant Examiner*—Terry L. Englund
*Attorney, Agent, or Firm*—David L. Smith

[57] ABSTRACT

An integrated circuit is disclosed that includes a sense amplifier having first and second transistors, each of which have a conduction path and a gate electrode. The conduction path of the first and second transistors are electrically coupled in series between a power supply node and an input. The integrated circuit also includes third and fourth transistors each having a conduction path and a gate electrode. The conduction path of the third and fourth transistors are electrically coupled in series between the power supply node and a first reference potential. The gate electrodes of the first and third transistors are electrically coupled to an output node. A fifth transistor has a conduction path electrically coupled between a second reference potential and the output node. The gate electrode is maintained at a voltage that is about two threshold voltage drops below the voltage level of the power supply node. The fifth transistor prevents the output voltage from going above a predetermined level and also improves access time of associated circuitry.

8 Claims, 2 Drawing Sheets

SENSE AMPLIFIER WITH OVERVOLTAGE PROTECTION

TECHNICAL FIELD

This invention relates to semiconductor memory devices, and in particular to sense amplifiers for memory devices that employ memory cells comprised of one or more transistors.

BACKGROUND OF THE INVENTION

The speed of operation of integrated circuits is limited by signal delay in long interconnect lines. As memories incorporate more memory cells, the decoding circuits become more complex increasing the length of lines through which signals must pass, and the column length increases slowing down signal propagation. Improvement in the speed of operation of memory circuits is desirable because applications demand higher speeds. Higher speeds correspond to shortening the access time of memories. Access time is the elapsed time from when an address is presented to a memory until data stored at that address is available at the memory output.

Speed improvements are possible when using current-mode signal transporting techniques as opposed to voltage-mode signal transporting techniques. A sense amplifier is used in a semiconductor memory to detect and amplify a small signal on a column or bit line, and forward the amplified signal to the output of the sense amplifier. Current-mode sense amplifiers, such as the current mode sense amplifier is disclosed in FIG. 5(a) of Current-mode Techniques for High-speed VLSI Circuits with Application to Current Sense Amplifier for CMOS SRAM's, IEEE Journal of Solid-States Circuits, vol.26, no. 4, April 1991, pp. 525–535, are subject to potential problems. Junction leakage, or a temporary power supply overvoltage, sometimes referred to as a bobble, cause a current-mode sense amplifier to require prolonged access time.

SUMMARY OF THE INVENTION

In accordance with an illustrative embodiment of the invention, an integrated circuit includes at least one sense amplifier having first and second transistors. Each of the first and second transistors have a conduction path and a gate electrode. The conduction path of the first and second transistors are electrically coupled in series between a power supply node and an input. The integrated circuit includes third and fourth transistors each having a conduction path and a gate electrode. The conduction path of the third and fourth transistors are electrically coupled in series between the power supply node and a first reference potential. The gate electrodes of the first and third transistors are electrically coupled to an output node. A fifth transistor has a conduction path electrically coupled between a second reference potential and the output node. The gate electrode is maintained at a voltage that is about two threshold voltage drops below the voltage level of the power supply node.

DETAILED DESCRIPTION

Figure 1:
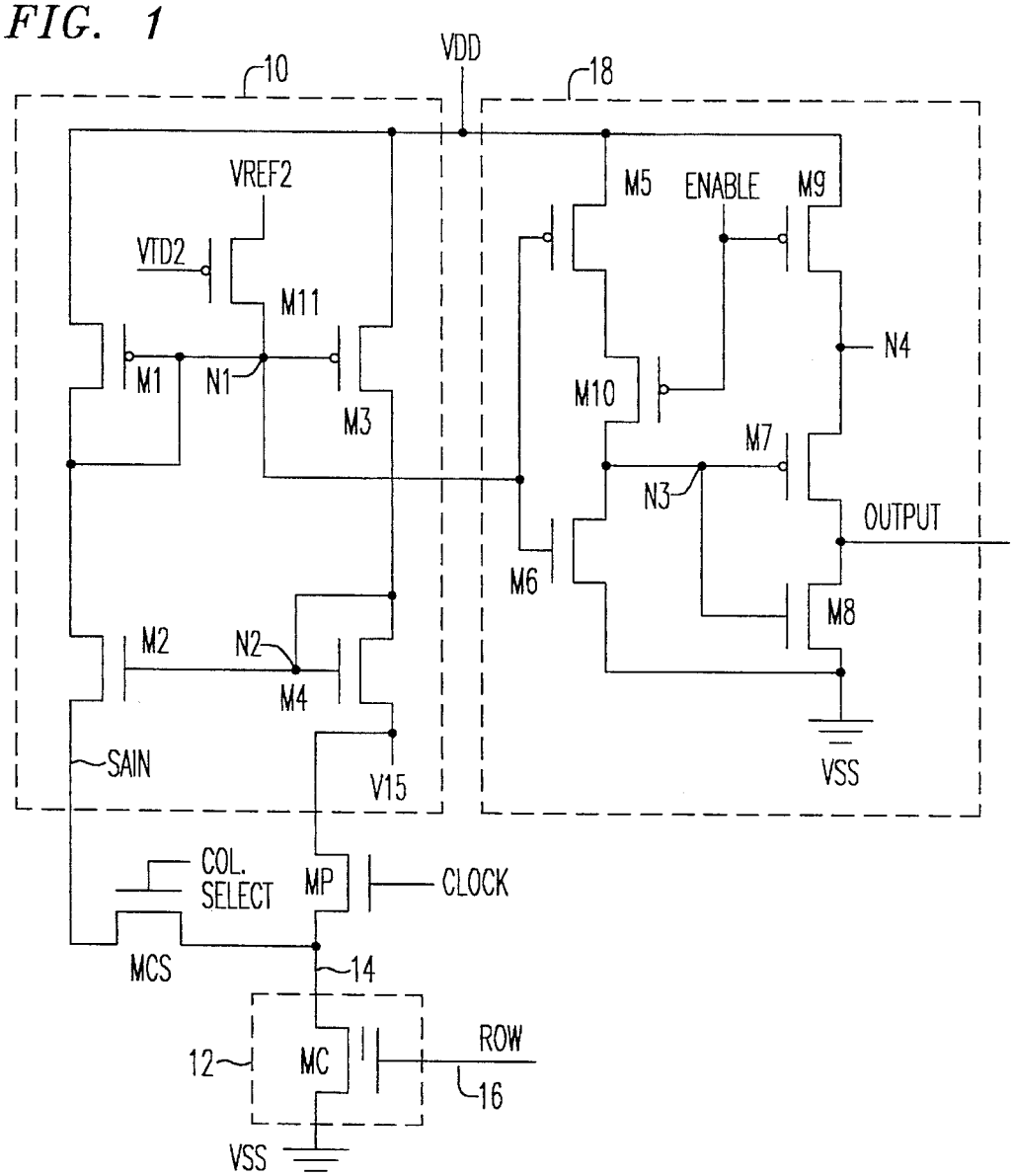
FIG. 1 is a schematic diagram of a sense amplifier in accordance with an illustrative embodiment of the invention.

FIG. 1 shows a schematic diagram of an illustrative embodiment of a sense amplifier 10, in accordance with the present invention. The sense amplifier and memory device are fabricated as part of an integrated circuit. The sense amplifier includes first and second transistor pairs and may include an output driver. A node common to the first and second transistor pairs is electrically coupled through a high impedance transistor to a reference potential. The high impedance transistor maintains one of the transistors in each of the first and second pairs of transistors at the edge of conduction, that is at the point where any increase in gate voltage will turn on the transistor in each of the first and second pairs of transistors maintained at the edge of conduction.

In a read operation, data stored in memory cells are accessed and presented at the output of the memory. Operation of the memory is driven by an external clock. Prior to accessing the data, conditions for reading are established in the memory during the high portion of the clock cycle known as precharge. The data is read during the low portion of a clock cycle known as access.

Transistor MC is illustrative of the memory cells in memory device 12. The memory cells are arranged in an array having rows and columns. As is known in the art, a row decoder selects a row line as determined by a row address, and a column decoder selects one or more column lines. A row line 16, labeled ROW enables the gate electrode of one or a row of memory cell transistors. Transistor MC is shown with its source terminal electrically coupled to ground potential, and its drain terminal electrically coupled to an output column line 14. Column line 14 is electrically coupled to SAIN as the input to a respective sense amplifier 10 through column select transistor MCS. Through precharge transistor MP, column line 14 is precharged to the voltage of V15 during the precharge portion of the memory cycle, or during the entire memory cycle as is known in the art. Precharge transistor MP maintains the input to sense amplifier 10 at the voltage level of reference V15 until pulled low by column line 14. There may be one sense amplifier for each column in memory device 12 or one sense amplifier multiplexed to a group of columns, as is known in the art. Transistor MC is illustrative of a memory cell in an electrical erasable read-only memory, but the invention is applicable to other forms of memory such as read-only memory and static or dynamic random access memory.

Sense amplifier 10 includes P-channel transistors M1, M3, and M11, as well as N-channel transistors M2, and M4. The transistor symbols drawn without the back gate connection assume that the back gate connection is coupled to ground for an N-channel transistor and to VDD for a P-channel transistor. The conduction paths of transistors M1 and M2 are coupled between power source VDD and SAIN as a first transistor pair. SAIN is electrically coupled to column line 14. The source of transistor M1 is electrically coupled to power source VDD. The gate of transistor M1 is coupled to node N1. The drain of transistor M1 and the drain of transistor M2 are also electrically coupled to node N1. The source of transistor M2 is electrically coupled to column line 14. The gate of transistor M2 is coupled to node N2.

The conduction path of transistors M3 and M4 are coupled between power source VDD and V15, as a second transistor pair. The source of transistor M3 is electrically coupled to power source VDD. The gate of transistor M3 is electrically coupled to node N1. The drain of transistor M3, as well as both the drain and gate of transistor M4, are electrically coupled to node N2. The source of transistor M2 is electrically coupled to V15.

Transistor M11 is coupled between node N1 and a reference potential VREF2, which is less than VDD and is typically ground. The source of transistor M11 is electrically coupled to node N1 and the drain is electrically coupled to reference potential VREF2. The gate of transistor M11 is coupled to VTD2, the generation of which is described below.

Output driver 18 includes P-channel transistors M5, M7, M9 and M10, as well as N-channel transistors M6 and M8. Transistors M5, M6, and M10 are coupled between power source VDD and ground potential, VSS. The source of transistor M5 is electrically coupled to power source VDD. The source of transistor M6 is coupled to the ground potential, VSS. The source of transistor M10 is electrically coupled to the source of transistor M5. The drain of transistor M10 is electrically coupled to the source of transistor M6 forming node N3. The gates of transistor M5 and M6 are both coupled to node N1.

Transistors M9, M7, and M8 are coupled between VDD and the ground potential, VSS. The source of transistor M9 is electrically coupled to power source VDD. The source of transistor M8 is coupled to ground potential, VSS. The source of transistor M7 is electrically coupled to the drain of transistor M9. The drain of transistor M7 is electrically coupled to the drain of transistor M8 forming the output. The gate of transistors M9 and M10 are coupled to ENABLE. The gates of transistors M7 and M8 are coupled to node N3.

Voltage level VTD2 is a voltage level slightly below two threshold voltage drops below the voltage of power source VDD. In the illustrative embodiment, voltage level VTD2 is generated by the circuit of FIG. 2. Transistors M12 and M13 are P-channel transistors. Transistor M14 is an N-channel transistor. Transistors M12, M13 and M14 are coupled between power source VDD and ground potential, VSS. The source of transistor M12 is electrically coupled to VDD. The drain of transistor M12 is electrically coupled to the source of transistor M13 and also to the gate of transistor M12. The drain and gate of transistor M13 are electrically coupled to node N5. Voltage level VTD2 is provided at node N5. The drain of transistor M14 is electrically coupled to node N5. The source of transistor M14 is electrically coupled to ground potential. Diode configured transistors M12 and M13 introduce two threshold voltage drops. Voltage VTD2 is slightly (for example 10 millivolts) below two threshold voltage drops below the voltage of VDD due to the operation of transistor M14 trying to pull node N5 toward ground.

In operation during precharge, SAIN and column line 14 maintain the source of transistor M2 above ground potential. In the illustrative embodiment, column line 14 and SAIN, are maintained at about 1.5 volts during precharge. V15 is also about 1.5 volts. During precharge, the sense amplifier is balanced. Nodes N1 and N2 stabilize and ideally no current flows in the conduction path of transistors M1 and M2, or transistors M3 and M4. When row line 16 transitions high signifying a read operation, transistor MC either conducts or does not conduct depending upon whether a logic zero or a logic one, respectively, is stored therein. When transistor MC does not conduct, column line 14 remains at a logic high and since amplifier 10 does not actively operate, i.e., maintains the same output. When transistor MC does conduct, transistor MC electrically couples column line 14 towards ground, which tries to pull column line 14 down to ground potential. Pulling SAIN toward ground potential from the high state triggers active operation of sense amplifier 10.

The stable condition at node N1 during precharge maintains node N1 at one P-channel threshold voltage drop below the voltage of power source VDD. Similarly, node N2 will be one N-channel threshold voltage drop above V15. For illustrative purposes, the threshold voltage drops for P-channel and N-channel devices are considered substantially identical, but they need not be. In the illustrative embodiment, VDD is 5 volts and the P-channel and N-channel threshold voltage drops are about 1 volt. Thus, at the stable condition node N1 is about 4 volts and node N2 is about 2.5 volts.

Transistor M1 is maintained at the edge of conduction. Transistors M1 and M11 operate to maintain the voltage at node N1 at a voltage level that is slightly less than (for example, 10 millivolts) one threshold voltage drop down from the voltage of VDD. Transistor M1 will remain conductive or turned on until such a voltage level is achieved at node N1, and will then be substantially turned off. Transistor M1 will be substantially turned off because to be turned on the gate voltage must be more than one threshold voltage drop down from the voltage of VDD.

Similarly, transistor M4 is maintained at the edge of conduction. Transistor M4 operates to pull node N2 down to slightly lower than (for example, 10 millivolts) one threshold voltage drop above the voltage of V15. Transistor M4 will remain conductive or turned on until such a voltage level is achieved at node N2, and will then be substantially turned off. Transistor M4 will be substantially turned off because the gate of transistor M4 will be slightly lower than one threshold voltage drop above V15. If node N2 were maintained at a higher voltage, when accessing a logic zero in transistor MC, SAIN would have to be pulled down to one threshold voltage drop above V15, which would undesirability increase access time.

During precharge, node N1 is substantially at a voltage level one threshold voltage drop below VDD, and node N2 is substantially one threshold voltage drop above V15. When the word line is driven high, ROW transitions high. When transistor MC stores a logic zero, transistor MC conducts when ROW transitions high and pulls SAIN toward ground potential, as can be seen in the timing diagrams of FIG. 3. When SAIN is pulled toward ground from about 1.5 volts, a greater than one threshold voltage drop difference develops between the gate of transistor M2 (node N2) and its source. This causes transistor M2 to turn on. When transistor M2 turns on, node N1 is electrically coupled through transistor M2 to SAIN, and through transistor MC to ground, which pulls the voltage at node N1 down toward ground. As the voltage at node N1 is pulled down toward ground, transistor M3 is turned on. Transistor M3 pulls node N2 up toward VDD, which feeds back and turns on transistor M2 even more. Eventually, this feedback loop reaches equilibrium in which node N1 is at a voltage level lower than it was during precharge and the voltage at node N1 is lower than one threshold voltage drop down from the voltage of VDD. The voltage level of node N1 drops a few hundred millivolts and stabilizes at a level above ground potential.

Transistor M11 is electrically coupled to node N1 to prevent the voltage at node N1 from going above a voltage level that is a threshold voltage drop down from the voltage of power source VDD. Should node N1 go to a voltage level that is higher than one threshold voltage drop below the voltage of VDD, transistor M11 will turn on and pull the voltage at node N1 down. Transistor M11 is a weak device providing a high impedance to VREF2. To achieve a weak device, transistor M11 has a longer channel length or narrower channel width than transistors M1, M2, M3 or M4.

Once the voltage at node N1 is pulled down to the proper voltage level of one threshold voltage drop below the voltage of VDD, transistor M11 substantially turns itself off.

In order for transistor M11 to be conductive, its gate must be at a voltage level that is more than one threshold voltage drop down from the voltage at node N1. Since the voltage at node N1 is at a voltage level that is a threshold voltage drop down from the voltage of VDD, VTD2 the voltage applied to the gate of transistor M11 is substantially two threshold voltage drops below the voltage at VDD.

As stated above, VTD2 is slightly lower than two threshold voltage drops below VDD. A high impedance path is thus established from node N1 to VREF2 through transistor M11, such that the voltage at node N1 will be pulled down to be slightly lower (for example, 10 millivolts) than one threshold voltage drop below VDD. This causes transistor M3 to conduct slightly trying to pull node N2 up from its equilibrium value of one threshold voltage drop above the voltage of V15. Because transistor M3 has a very high impedance under this operating condition, the voltage at node N2 is pulled up only a few millivolts, which does not substantially change the operation of sense amplifier 10. However, the conduction through transistor M3 will prevent the voltage at node N2 from going below a threshold voltage drop above the voltage of V15 as could be caused by, for example, junction leakage on the drain of transistor M4.

Figure 2:
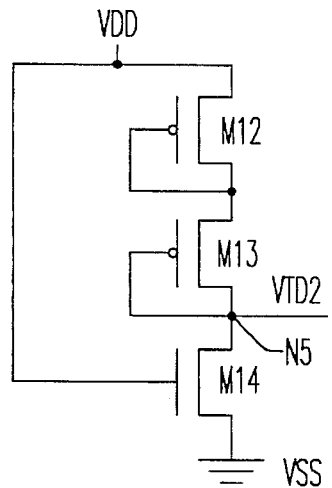
FIG. 2 is a schematic diagram of a circuit for generating a voltage level used in the sense amplifier of FIG. 1.
Figure 3A:
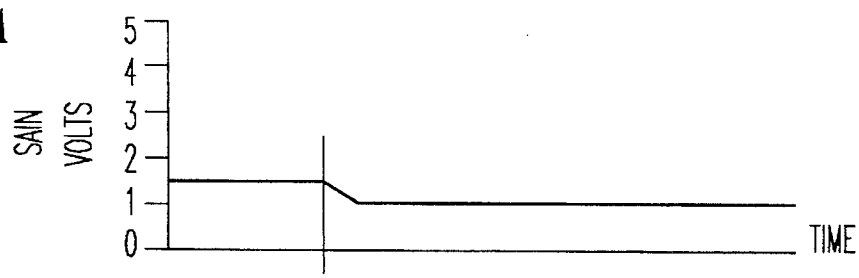
FIG. 3 is a graphic representation of the voltages appearing at various points in the schematic diagram of FIG. 1, plotted as a function of time.
Figure 3B:
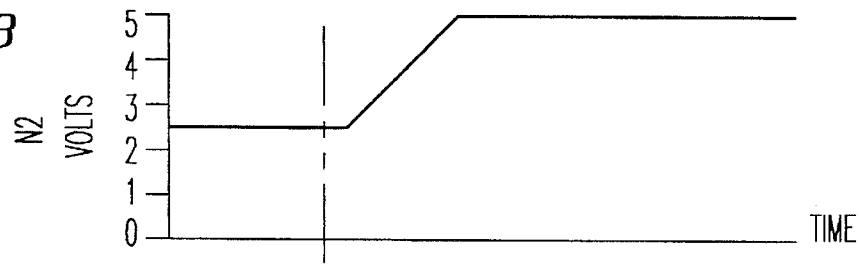
Figure 3C:
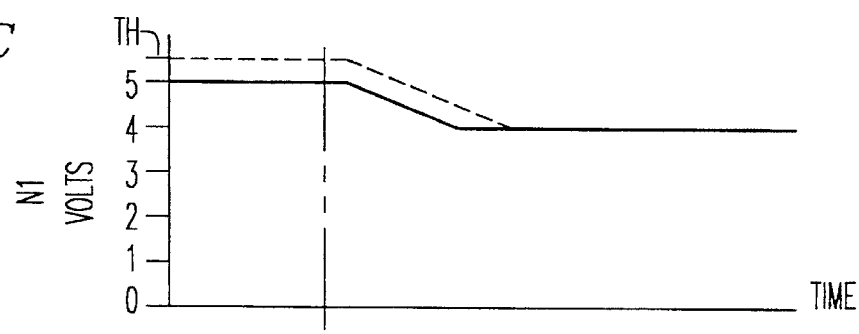
Figure 3D:
Figure 3E:
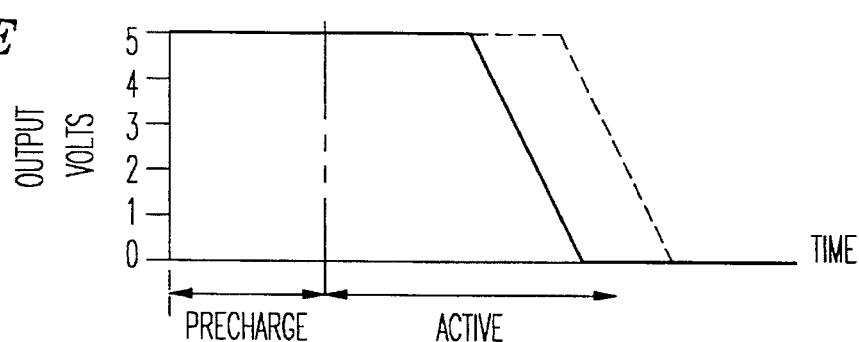

Transistor M10 is employed to power-down sense amplifier 10. With its gate electrically coupled to ENABLE, which is held at ground potential to turn on transistor M10, transistor M10 is maintained in the on-state during operation of sense amplifier 10. Transistors M5 and M6 form an inverter. The inverter is sized such that P-channel transistor, M5, has a much higher gain than the N-channel transistor, M6. The width of transistor M5 is, for example, ten times greater than the width of transistor M6. In the illustrative embodiment, the width of transistor M5 is 20 μm whereas the width of transistor M6 is 2 μm. The channel length of transistor M6 is 2.5 μm. The channel length of transistor M5 is 0.9 μm. The channel dimensions of all other transistors shown in FIGS. 1 and 2 are listed in Table 1. For the illustrative embodiment shown in FIG. 1, the channel dimensions of the transistors are shown in Table 1.

TABLE 1

|  | width, μm | length, μm |
|---|---|---|
| M1 | 6 | 0.9 |
| M2 | 6 | 1.3 |
| M3 | 6 | 0.9 |
| M4 | 6 | 1.3 |
| M5 | 20 | 0.9 |
| M6 | 2 | 2.5 |
| M7 | 9 | 0.9 |
| M8 | 6 | 0.9 |
| M9 | 9 | 0.9 |
| M10 | 5 | 0.9 |
| M11 | 2 | 5 |
| M12 | 90 | 0.9 |
| M13 | 90 | 0.9 |
| M14 | 2 | 10 |

The inverter is sized such that the P-channel transistor M5 needs to be turned on only slightly, that is its gate voltage needs to be more than one threshold voltage drop below the voltage of VDD for example, 200 millivolts below one threshold voltage drop below VDD. When node N1 is one threshold voltage drop below the voltage of VDD, transistor M5 is not in the off-state. Conversely, transistor M6 is in the on-state. Transistor M6 being conductive pulls node N3 to ground. When a zero is read from transistor MC, the voltage at node N1 is pulled down about one-half volt. That is sufficient to turn on transistor M5. Because of its size, transistor M5 overpowers transistor M6, which is still on, and pulls up the voltage at node N3 almost to the level of voltage of VDD. When the voltage at node N3 is pulled up, the inverter output changes state. This can be seen in the graphical representation of the voltage level of node N3 in FIG. 3. Node 3 starts at ground potential and rises to a voltage level that is a little less than the voltage of VDD. The voltage at node N3 is less than the voltage at VDD because transistor M6 is still conducting, trying to pull the voltage at node N3 to ground potential.

In the last stage of output driver 18, transistor M9 is employed to power-down sense amplifier 10. Transistor M9, with its gate coupled to ENABLE, maintains transistor M9 in the on-state during sense amplifier 10 operation. Transistors M7 and M8 form an inverter that operates as a buffer to buffer the signal to drive the output. The output signal is substantially the inverse of the voltage at node N3, as can be seen in the graphical representation of the output in FIG. 3.

During precharge, node N1 is maintained one voltage drop threshold below the voltage of VDD, and node N2 is one voltage drop threshold above V15. At least two potential problems could cause node N1 to shift to a voltage level greater than one threshold voltage drop below the voltage of VDD, which would cause a prolonged access time. The power supply could incur a temporary overvoltage, known as a bobble, then return to its normal operating voltage. During the transient, the voltage at node N1 tracks the voltage of VDD but at a level that is one threshold voltage drop below the voltage of VDD. Transistor M11 pulls the voltage at node N1 back to the proper level, one threshold voltage drop below the voltage of VDD, when the voltage of VDD returns to the proper voltage. Absent transistor M11, the voltage at node N1 would follow up the transient at one threshold voltage drop below the voltage of VDD, but would not follow the transient down. When the next subsequent access occurred, node N1 would have to be pulled down from its transient high, TH, as shown in a broken line in FIG. 3, to and beyond one threshold voltage level below the voltage of VDD in normal operation in order to cause the sense amplifier 10 to operate. To pull the voltage at node N1 down upon initiating an access subsequent to conditions of the bobble causes longer access time. The reason for the longer access time is the necessity to discharge the parasitic capacitance associated with node N1 from a higher voltage level. Transistor M2 discharges the parasitic capacitance to ground through transistor MC, the memory cell. Discharging this resistor-capacitor network from a higher voltage takes more time, undesirably extending access time of the memory.

Leakage from the drain junction of transistor M1 to the tub in which transistor M1 is formed, a defect in transistor M1 that could pull node N1 up to or up towards the voltage of VDD, could also undesirably prolong access time of the memory. The tub is maintained at the voltage level of VDD. In the absence of transistor M11 to pull the voltage at node N1 down, access time would be undesirably extended. While the leakage would be present at all times, it would only have an adverse impact during precharge.

While the circuits have been described herein as having transistors of a particular type, it is understood that the circuit functions can be achieved using other types of devices.

I claim:

1. An integrated circuit including a current mode sense amplifier, the current mode sense amplifier comprising:

first and second transistors each having a conduction path and a gate electrode, the conduction path of said first and second transistors in series between a power supply node and an input;

third and fourth transistors each having a conduction path and a gate electrode, the conduction path of said third and fourth transistors in series between the power supply node and a first reference potential, the gate electrodes of the first and third transistors each electrically coupled to an output node; and a fifth transistor, the fifth transistor having a conduction path and a gate electrode, the conduction path electrically coupled between a second reference potential and the output node, the gate electrode maintained at a voltage that is about two threshold voltage drops below the voltage level of the power supply node.

2. An integrated circuit as recited in claim 1, wherein the second reference potential is ground.

3. An integrated circuit as recited in claim 1, further comprising:

an inverter having an input and an output, the output node coupled to the input of the inverter.

4. An integrated circuit as recited in claim 3, wherein the inverter further comprises:

sixth and seventh transistors each having a channel width-to-length ratio, the channel width-to-length ratio of one of the sixth or seventh transistors being larger than the channel width-to-length of the other transistor.

5. An integrated circuit as recited in claim 4, wherein the channel width-to-length ratio of one of the sixth or seventh transistors being about ten times larger than the channel width-to-length ratio of the other transistor.

6. An integrated circuit as recited in claim 3, further comprising:

a buffer having an input and an output, the output of the inverter coupled to the input of the buffer.

7. An integrated circuit as recited in claim 2, wherein the second reference potential is less than the first reference potential.

8. An integrated circuit as recited in claim 1, wherein the first and third transistors are P-channel devices and the second and fourth transistors are N-channel transistors.

* * * * *